(12) United States Patent
Hu et al.

(10) Patent No.: US 8,670,256 B2
(45) Date of Patent: Mar. 11, 2014

(54) CONTROLLER APPARATUS FOR CONTROLLING A MULTIPHASE MULTILEVEL VOLTAGE SOURCE INVERTER AND A METHOD THEREOF

(75) Inventors: Jwu-Sheng Hu, Hsinchu (TW);
Keng-Yuan Chen, Hsinchu (TW);
Chi-Him Tang, Hsinchu (TW)

(73) Assignee: National Chiao Tung University (TW)

( * ) Notice: Subject to any disclaimer, the term of this patent is extended or adjusted under 35 U.S.C. 154(b) by 526 days.

(21) Appl. No.: 12/903,280

(22) Filed: Oct. 13, 2010

(65) Prior Publication Data
US 2012/0002453 A1  Jan. 5, 2012

(30) Foreign Application Priority Data
Jun. 30, 2010 (TW) .............................. 99121593 A (51) Int. Cl.
  *H02M 7/483* (2007.01)
  *H02M 7/501* (2007.01)
(52) U.S. Cl.
  USPC ................. 363/95; 363/43; 363/97; 363/131
(58) Field of Classification Search
  USPC .......................... 363/43, 95, 97, 98, 131, 132
  See application file for complete search history.

(56) References Cited

U.S. PATENT DOCUMENTS

| 6,031,738 | A  | * | 2/2000 | Lipo et al. ........................ 363/37 |
| 6,900,998 | B2 | * | 5/2005 | Erickson et al. ............... 363/159 |
| 8,107,267 | B2 | * | 1/2012 | Tallam et al. .................... 363/37 |

| 2003/0062774 | A1 | * | 4/2003 | Escobar et al. ................. 307/64 |
| 2004/0056629 | A1 | * | 3/2004 | Maeda et al. .................. 318/719 |
| 2004/0057262 | A1 | * | 3/2004 | Tanaka et al. ................. 363/132 |
| 2007/0200607 | A1 | * | 8/2007 | Ohshima et al. .............. 327/256 |

FOREIGN PATENT DOCUMENTS

| JP | 8107698 A2 | 4/1996 |
| JP | 2009232546 A2 | 10/2009 |

OTHER PUBLICATIONS

Duran, M.J., et al. "Multi-Dimensional Space Vector Pulse Width Modulation Scheme for Five-Phase Series-Connected Two-Motor Drives," Electric Machines & Drives Conference, 2007. IEEE International, vol. 2, pp. 1208-1214, May 3-5, 2007. doi: 10.1109/IEMDC.2007.383602 URL: http://ieeexplore.ieee.org/stamp/stamp.jsp?tp=&arnumber=4270822&isnumber=4270762.*
Grandi, G., et al. "Space vector modulation of a seven-phase voltage source inverter," Power Electronics, Electrical Drives, Automation and Motion, International Symposium on, pp. 1149,1156, May 23-26, 2006. doi: 10.1109/SPEEDAM.2006.1649941 URL: http://ieeexplore.ieee.org/stamp/stamp.jsp?tp=&arnumber=1649941&isnumber=34594.*

(Continued)

*Primary Examiner* — Adolf Berhane
*Assistant Examiner* — Fred E Finch, III
(74) *Attorney, Agent, or Firm* — Volpe and Koenig, P.C.

(57) ABSTRACT

The present invention provides an apparatus for controlling a multiphase multilevel voltage source inverter. The apparatus includes a signal-generating unit and a converter. The signal-generating unit responds to an input signal to produce a switching strategy control signal and a duration timing control signal corresponding to the switching strategy control signal. The converting unit responds to the switching strategy control signal and the duration timing control signal to produce a switching signal. The voltage source inverter responds to the switching signal to generate a multiphase-and-multilevel AC voltage output.

17 Claims, 5 Drawing Sheets

(56) References Cited

OTHER PUBLICATIONS

Lega, A., et al. "Space Vector Modulation for Multiphase Inverters Based on a Space Partitioning Algorithm," Industrial Electronics, IEEE Transactions on, vol. 56, No. 10, pp. 4119-4131, Oct. 2009. doi: 10.1109/TIE.2009.2020701 URL: http://ieeexplore.ieee.org/stamp/stamp.jsp?tp=&arnumber=4838874&isnumber=5238769.*

* cited by examiner

CONTROLLER APPARATUS FOR CONTROLLING A MULTIPHASE MULTILEVEL VOLTAGE SOURCE INVERTER AND A METHOD THEREOF

FIELD OF THE INVENTION

The present invention relates to a control apparatus for a DC/AC converter, particularly a control apparatus for a multiphase multilevel voltage source inverter.

BACKGROUND OF THE INVENTION

Voltage source inverter is a necessary circuit for driving a motor. By controlling the status of open or close of the components in the voltage source inverter, it can generate required current to drive the motor. Traditional control strategies of three-phase voltage source inverters include sinewave pulse-width modulator, SPWM, and space vector pulse-width modulator, SVPWM. Multiple-phase motors are advantageous over three-phase motors in the improvement of magnetomotive forces, the reduction of stator copper losses, the increase of motor operation efficiency, the noise reduction and the reduction of pulsating torque. When considering driving a multi-phase motor, one would face the issue of expansion for using either one of the two traditional types of modulators.

However, the strategy of controlling the multi-phase voltage source inverter and the applicability thereof are important when considering taking advantage of the multiple-phase motors. Although the operation of a SPWM is quite simple, and is easy to be expanded to multi-phase structures, the DC voltage usage rate thereof is decreased along with the increase of the number of phases, which is thus impractical. The use of several types of multi-phase SVPWM is restricted due to the required massive calculation circuit for performing calculations of high dimensional matrix inverse and trigonometric functions as well.

SUMMARY OF THE INVENTION

To overcome the abovementioned drawback, the present invention provides an apparatus for controlling a multiphase multilevel voltage source inverter. The apparatus includes a signal-generating unit and a converter. The signal-generating unit responds to an input signal to produce a switching strategy control signal and a duration timing control signal corresponding to the switching strategy control signal. The converting unit responds to the switching strategy control signal and the duration timing control signal to produce a switching signal. The voltage source inverter responds to the switching signal to generate a multiphase-and-multilevel AC voltage output.

Preferably, the signal-generating unit includes a sorting unit, a subtracting unit and a re-assembling unit. The sorting unit receives the input signal being a digital signal, and generates a plurality of data by using the input signal. The plurality of data represent multiple phases of the AC voltage output to be generated by the voltage source inverter and are denoted by a first vector having plural elements, and the sorting unit sorts the plural elements of the first vector to obtain a second vector having plural sorted elements and obtains a first matrix based on the first and the second vectors. The subtracting unit configured to (a) obtain a third vector by preceding a first one of the sorted elements of the second vector by an element having a value of 1, and by removing a last one of the sorted elements therefrom; (b) obtain a fourth vector by replacing a value of the first one of the sorted elements of the second vector with a difference between the first one and the last one of the sorted elements of the second vector; and (c) obtain a fifth vector by subtracting the fourth vector from the third vector. The re-assembling unit obtains a second matrix based on a transposed matrix of the first matrix and a pre-defined matrix. Values of the sorted elements of the second matrix are associated with the switching strategy control signal, and values of elements of the fifth vector are associated with the duration timing control signal.

Preferably, the second vector is a product of the first matrix and the first vector.

Preferably, the pre-defined matrix is an upper-triangular matrix.

Preferably, the apparatus further includes a 5-phase and 7-level switching unit. The switching unit has a first, a second, a third, a fourth and a fifth switching units. The first switching unit outputs a first phase voltage output. The second switching unit outputs a second phase voltage output. The third switching unit outputs a third phase voltage output. The fourth switching unit outputs a fourth phase voltage output. The fifth switching unit outputs a fifth phase voltage output. Each of the phase voltage outputs has a respective one of seven voltage levels.

Preferably, the converting unit uses the switching signal to control each of the switching units to be switched to a respective one of the seven voltage levels.

Preferably, the signal-generating unit includes a decomposition unit, a sorting unit, a subtracting unit and a re-assembling unit. The decomposition unit receives the input signal being a digital signal, and generates a plurality of data by using the input signal. The plurality of data represent multiple phases of the AC voltage output to be generated by the voltage source inverter. The decomposition unit decomposes each of the plurality of data into an integer and a decimal fraction ranging between 1 and −1. The sorting unit obtains a first vector having plural elements based on the decimal fraction of the each data, sorts the elements of the first vector to obtain a second vector having plural sorted elements, and obtains a first matrix based on the first and the second vectors. The re-assembling unit obtains a second matrix based on a transposed matrix of the first matrix and a pre-defined matrix, and obtains a third matrix by performing an addition and a translation operations to the second matrix. Values of elements of the third matrix are associated with the switching strategy control signal, and those of the fifth vector are associated with the duration timing control signal.

In accordance with another aspect of the present invention, an apparatus for controlling a multiphase multilevel voltage source inverter is provided. The apparatus includes a means for receiving an input signal, and generating a switching strategy control signal and a duration timing control signal corresponding to the switching strategy control signal in response to the input signal; and a means for generating a switching signal in response to the switching strategy control signal and the duration timing control signal, and controlling the voltage source inverter to generate voltage outputs with multiphase and multilevel in response to the switching signal.

In accordance with a further aspect of the present invention, a method for controlling a voltage source inverter is provided. The method includes steps of: (a) generating a switching strategy control signal and a duration timing control signal corresponding to the switching strategy control signal in response to an input signal; and (b) generating a switching signal in response to the switching strategy control signal and the duration timing control signal, and controlling the voltage source inverter to generate a multiphase-and-multilevel voltage output in response to the switching signal.

Preferably, the step (a) further includes sub-steps of: (a1) using the input signal, which is a digital signal, to generate a plurality of data forming a first vector, and sorting the plurality of data to obtain a second vector; (a2) obtaining two vectors based on the second vector, and subtracting one from the other of the two vectors to obtain a third vector denoting an input period of the duration timing control signal; and (a3) obtaining a first matrix, wherein the second vector is a product of the first matrix and the first vector, and obtaining a second matrix by multiplying a transposed matrix of the first matrix with a pre-defined matrix.

Preferably, the step (a) further includes a sub-step of (a4) generating the switching signal based on the switching strategy control signal and the input period of the duration timing control signal.

Preferably, the step (a2) further includes sub-steps of (a2-1) obtaining a fourth vector by preceding a first element of the second vector by an element having a value of 1, and by removing a last element of the second vector therefrom; (a2-2) obtaining a fifth vector by replacing the first element of the second vector with a difference between the first and the last elements of the second vector; and (a2-3) obtaining the third vector by subtracting the fifth vector from the fourth vector.

Preferably, the step (a) further includes sub-steps of: (a1) using the input signal being a digital signal to generate a plurality of data, and decomposing each of the plurality of data into an integer and a decimal fraction ranging between 1 and −1; (a2) obtaining a first vector having plural elements based on the decimal fractions of the each data, and sorting the plural elements of the first vector to obtain a second vector; (a3) obtaining two vectors based on the second vector, and subtracting one from the other of the two vectors to obtain a third vector denoting an input period of the duration timing control signal; (a4) obtaining a first matrix, wherein the second vector is a product of the first matrix and the first vector, and obtaining a second matrix by multiplying a transposed matrix of the first matrix with a pre-defined matrix; and (a5) obtaining a third matrix by performing an addition and a translation operations to the second matrix.

Preferably, the step (a3) further includes sub-steps of: (a3-1) obtaining a fourth vector by preceding a first element of the second vector by an element having a value of 1, and by removing a last element of the second vector therefrom; (a3-2) obtaining a fifth vector by replacing the first element of the second vector with a difference between the first and the last elements of the second vector; and (a3-3) obtaining the third vector by subtracting the fifth vector from the fourth vector, and the step (a5) further includes sub-steps of: (a5-1) obtaining a fourth matrix by adding a corresponding integer of the each data into the respective each element of the second matrix, wherein the corresponding integer is decomposed from the each data; and (a5-2) performing one of operations of adding a value to and subtracting the value from each element in a same column in the fourth matrix to obtain the third matrix, wherein the third matrix has plural elements, each of which are equal to or larger than zero after adding or subtracting operations.

The above objects and advantages of the present invention will be more readily apparent to those ordinarily skilled in the art after reading the details set forth in the descriptions and drawings that follow, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1A:
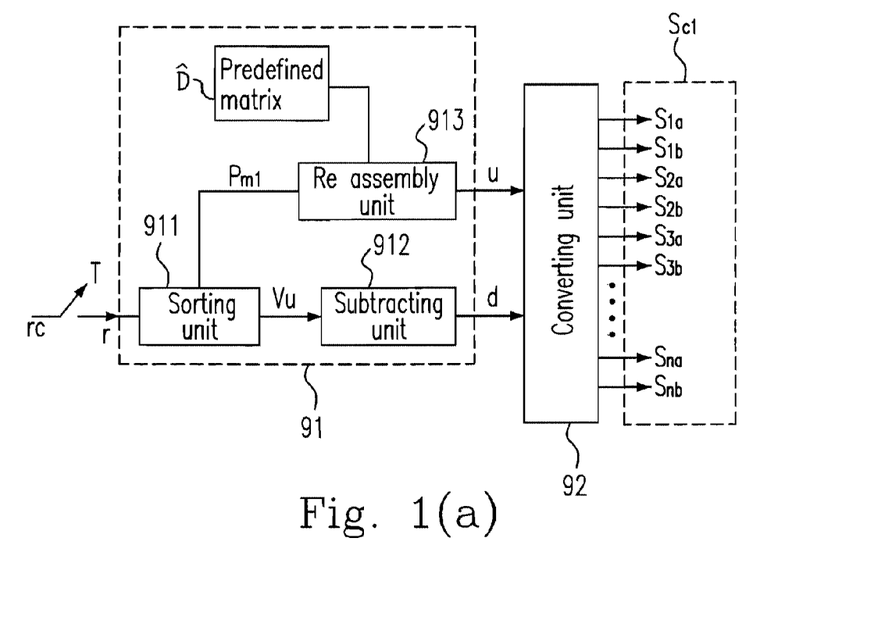
FIG. 1(a) is a schematic diagram illustrating an apparatus for controlling a two-level multiphase voltage source inverter in accordance with the first embodiment of the present invention.

Please refer to FIG. 1(a), which is a schematic diagram showing an apparatus for controlling a two-level multiphase voltage source inverter in accordance with the first embodiment of the present invention. The apparatus 9 for controlling a voltage source inverter includes a signal-generating unit 91 and a converting unit 92. The signal-generating unit 91 has a sorting unit 911, a subtracting unit 912 and a re-assembly unit 913.

The signal generating unit 91 responds to an input signal r to produce a switching strategy control signal u and a duration timing control signal d corresponding to the switching strategy control signal u. The converting unit 92 responds to the switching strategy control signal u and the duration timing control signal d to produce a switching signal Sc1. According to FIG. 1(a), the switching signal Sc1 includes S1a, S1b, S2a, S2b, . . . Sna and Snb.

Figure 1B:
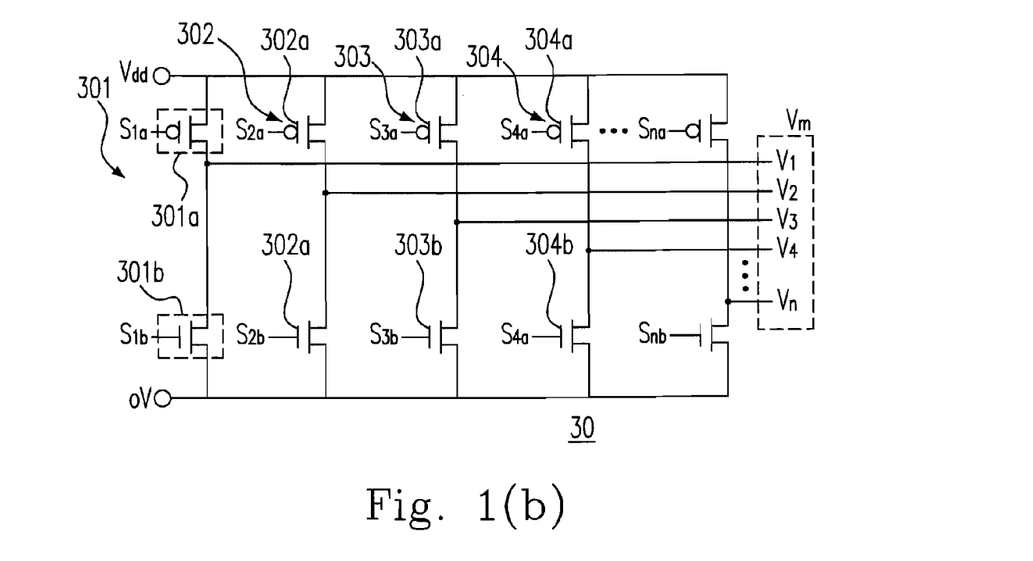
FIG. 1(b) is a schematic diagram illustrating the voltage source inverter in accordance with the first embodiment of the present invention.

Please refer to FIG. 1(b), which is a schematic diagram of a two-level multiphase voltage source inverter in accordance with the first embodiment of the present invention. The voltage source inverter 30 includes a first, a second, a third, and a fourth inverters, 301, 302, 303 and 304, and these inverters are coupled with each other. The number of inverters in voltage source inverter 30 can be raised per requirements. The first inverter 301 has a first p-type transistor 301a and a first n-type transistor 301b. The second inverter 302 has a second p-type transistor 302a and a second n-type transistor 302b. The third inverter 303 has a third p-type transistor 303a and a third n-type transistor 303b. The fourth inverter 304 has a fourth p-type transistor 304a and a fourth n-type transistor 304b. The voltage source inverter 30 responds to the switching signal Sc1 to generate a multiphase-and-multilevel AC voltage output Vm, which comprises phase voltages V1, V2 . . . and Vn. Each of the phase voltages, V1, V2 . . . and Vn, has a plurality of levels. In the first embodiment, the first, the second, the third and the fourth inverters, 301, 302, 303 and 304 generate the phase voltages, V1, V2, V3 and V4, respectively. Two levels exist in each of the phase voltages, V1, V2 . . . and Vn, according to the first embodiment of the present invention for the purpose of giving examples. An example of multiple levels will be introduced later.

In the first embodiment, the input signal r is obtained by sampling a signal rc at a sampling period of T. The input signal r is the phase voltage to be associated with the phase voltage of a load (not shown). Assuming the input signal r has been normalized, is a digital signal, and $r \in R^n$, the input signal r is used for generating plural data, denoted by a first vector μ, which represent the multi-phase voltages to be generated by the voltage source inverter 30. The sorting unit 911 sorts the first vector μ to obtain a second vector Vu, and obtains a first matrix Pm1, where $Pm1 \in R^{n \times n}$, based on the first and the second vectors. The second vector Vu has a first element Vu1 and a last element Vun. The first and the second vectors, μ and Vu, are shown as follows:

$$\mu = \begin{bmatrix} u1 \\ u2 \\ M \\ un \end{bmatrix} \quad Vu = \begin{bmatrix} Vu1 \\ Vu2 \\ M \\ Vun \end{bmatrix},$$

where Vu1>Vu2> . . . >Vun

The subtracting unit 912 configured to obtain a third vector û3 by preceding a first one of the sorted elements of the second vector Vu by an element having a value of 1, and by removing a last one of the sorted elements therefrom. The subtracting unit 912 configured to obtain a fourth vector û4 by replacing a value of the first one of the sorted elements of the second vector Vu with a difference between the first one and the last one of the sorted elements of the second vector Vu. The subtracting unit 912 configured to obtain a fifth vector û5 by subtracting the fourth vector û4 from the third vector û3.

$$\hat{U}5 = \hat{u}3 - \hat{u}4 = \begin{bmatrix} 1 \\ Vu1 \\ Vu2 \\ M \\ Vu(n-1) \end{bmatrix} - \begin{bmatrix} Vu1 - Vun \\ Vu2 \\ Vu3 \\ M \\ Vun \end{bmatrix}$$

The second vector Vu is a product of the first matrix Pm1 and the first vector μ. Since the second vector Vu has been sorted, referring to the first embodiment for instance, locations of the sorted elements follow a decreasing order, and the first vector μ is known, the first matrix Pm1 can be obtained.

The re-assembling unit 913 obtains a second matrix $\mu_f$ based on a transposed matrix $Pm1^T$ of the first matrix Pm1 and a pre-defined matrix $\hat{D}$. Values of the sorted elements of the second matrix $\mu_f$ are associated with the switching strategy control signal u, and values of elements of the fourth vector û4 are associated with the duration timing control signal d. Preferably, the second matrix $\mu_f = Pm1^T \hat{D}$, and the pre-defined matrix $\hat{D}$ is an upper-triangular matrix:

$$\hat{D} = \begin{bmatrix} 0 & 1 & 1 & 1 \\ 0 & 0 & M & M \\ M & M & O & 1 \\ 0 & 0 & \Lambda & 0 \end{bmatrix} \in R^{n \times n}$$

The column vectors of the second matrix $\mu_f$ represents the switching strategy adopted by the apparatus 9 for controlling a voltage source inverter during the sampling period T. Values of elements of the fourth vector û4 are associated with the duration timing control signal d. Therefore, the apparatus 9 for controlling a voltage source inverter of the present invention only needs the sorting unit 911, subtracting unit 912 and reassembly unit 913 to implement the control for multiple phases and multiple levels voltage source inverters, is easy to expand, and does without complicated calculations and massive memory space.

Figure 1C:
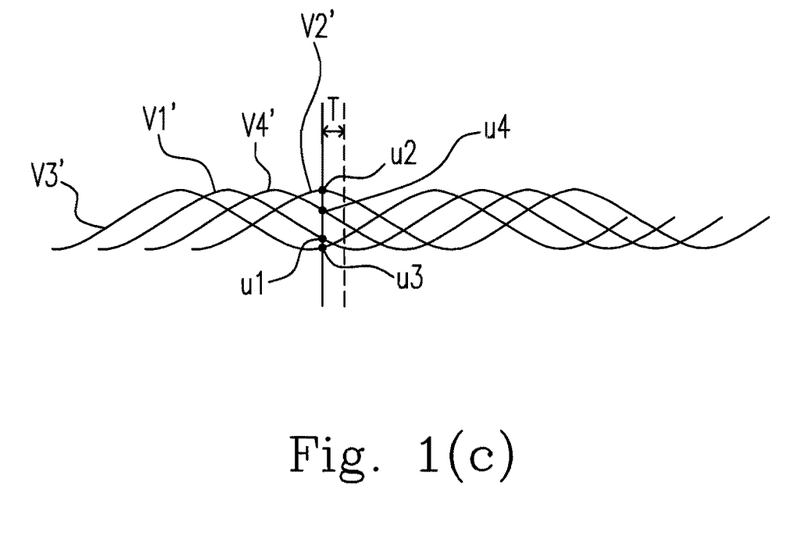
FIG. 1(c) is a schematic diagram showing four phase voltages associated with the loading in accordance with the first embodiment of the present invention.

According to the first embodiment of the present invention, referring to in FIG. 1(c) which schematics four phase voltages associated with the loading, a four-phase AC voltage is generated for instance. The u1, u2, u3 and u4 denote the voltages sampled after the sampling period T, V1', V2', V3' and V4', respectively. Assuming that the Vdd in FIG. 1.(b) is 3 volts and every 0.5 of the value indicates 1.5 volts, and the values of u1, u2, u3 and u4 are 0.2, 0.3, -0.3 and -0.2 respectively, the first vector:

$$\mu = \begin{bmatrix} -0.2 \\ +0.3 \\ -0.3 \\ +0.2 \end{bmatrix}$$

The second vector Vu can be obtained by using the sorting unit 911 to sort the first vector μ:

$$Vu = \begin{bmatrix} +0.3 \\ +0.2 \\ -0.2 \\ -0.3 \end{bmatrix}$$

The first matrix Pm1 can be obtained based on the formula Pm1*μ=Vu:

$$Pm1 \times \begin{bmatrix} -0.2 \\ +0.3 \\ -0.3 \\ +0.2 \end{bmatrix} = \begin{bmatrix} +0.3 \\ +0.2 \\ -0.2 \\ -0.3 \end{bmatrix}, \text{therefore } Pm1 = \begin{bmatrix} 0 & 1 & 0 & 0 \\ 0 & 0 & 0 & 1 \\ 1 & 0 & 0 & 0 \\ 0 & 0 & 1 & 0 \end{bmatrix}$$

The fifth vector $$\hat{u}5 = \hat{u}3 - \hat{u}4 = \begin{bmatrix} +1 \\ +0.3 \\ +0.2 \\ -0.2 \end{bmatrix} - \begin{bmatrix} 0.3+0.3 \\ +0.2 \\ -0.2 \\ -0.3 \end{bmatrix} = \begin{bmatrix} 0.4 \\ 0.1 \\ 0.4 \\ 0.1 \end{bmatrix}$$

The second matrix $$\mu_f = Pm1_{\hat{D}}^T = \begin{bmatrix} 0 & 0 & 1 & 0 \\ 1 & 0 & 0 & 0 \\ 0 & 0 & 0 & 1 \\ 0 & 1 & 0 & 0 \end{bmatrix} \times \begin{bmatrix} 0 & 1 & 1 & 1 \\ 0 & 0 & 1 & 1 \\ 0 & 0 & 0 & 1 \\ 0 & 0 & 0 & 0 \end{bmatrix} = \begin{bmatrix} 0 & 0 & 0 & 1 \\ 0 & 1 & 1 & 1 \\ 0 & 0 & 0 & 0 \\ 0 & 0 & 1 & 1 \end{bmatrix}$$

Thus, the first column vector of the second matrix $$\mu_f = \begin{bmatrix} 0 \\ 0 \\ 0 \\ 0 \end{bmatrix},$$

which indicates the output voltages of the invertors 301, 302, 303 and 304 are all zeros during a time period of 0.4 T.

The second column vector of the second matrix $$\mu_f = \begin{bmatrix} 0 \\ 1 \\ 0 \\ 0 \end{bmatrix},$$

which indicates the output voltage of the second inverter is 3 volts while that of the invertors 301, 303 and 304 are all zeros, during a time period of 0.1 T.

The third column vector of the second matrix $$\mu_f = \begin{bmatrix} 0 \\ 1 \\ 0 \\ 1 \end{bmatrix},$$

which indicates the output voltage of the inverters 302 and 304 are 3 volts while that of the invertors 301 and 303 are zero, during a time period of 0.4 T. Output voltages and duration of the other invertors can be derived by the same method.

Again, referring to FIG. 1(*b*), the first row vector of the second matrix $\mu_f$ is associated with the switching strategy for controlling the first inverter 301. The first and the second elements of the first row vector [0001] are zero, which indicates the method of controlling the voltage source inverter 30 is: the switching signal S1*a* to instruct the first p-type transducer 301*a* opened, while the switching signal S1*b* to instruct the first n-type transducer 301*b* conducted. The duration periods corresponding to the first, second, third and fourth elements of the first row vector are 0.4 T, 0.1 T, 0.4 T and 0.1 T. The relation between each switching status and the line voltages V12, V23 and V31 are shown as the following table:

| No. | V12 | V23 | V31 | 301a | 301b | 302a | 302b | 303a | 303b |
|---|---|---|---|---|---|---|---|---|---|
| 1 | 0 | 0 | 0 | Off | On | Off | On | Off | On |
| 2 | 1 | 0 | -1 | On | Off | Off | On | Off | On |
| 3 | 0 | 1 | -1 | Off | On | On | Off | Off | On |
| 4 | -1 | 1 | 0 | Off | On | On | Off | On | Off |
| 5 | -1 | 0 | 1 | Off | On | Off | On | On | Off |
| 6 | 0 | -1 | 1 | Off | On | Off | On | On | Off |
| 7 | 1 | -1 | 0 | On | Off | Off | On | On | Off |
| 8 | 0 | 0 | 0 | On | Off | On | Off | On | Off |

The voltage source inverter 30 in the first embodiment can work with two DC voltage level Vdd and 0 only, to generate AC current. The embodiments set forth below includes examples of providing plural voltage levels and dealing with the input signal r having at least a value which is not a decimal fraction.

Figure 2:
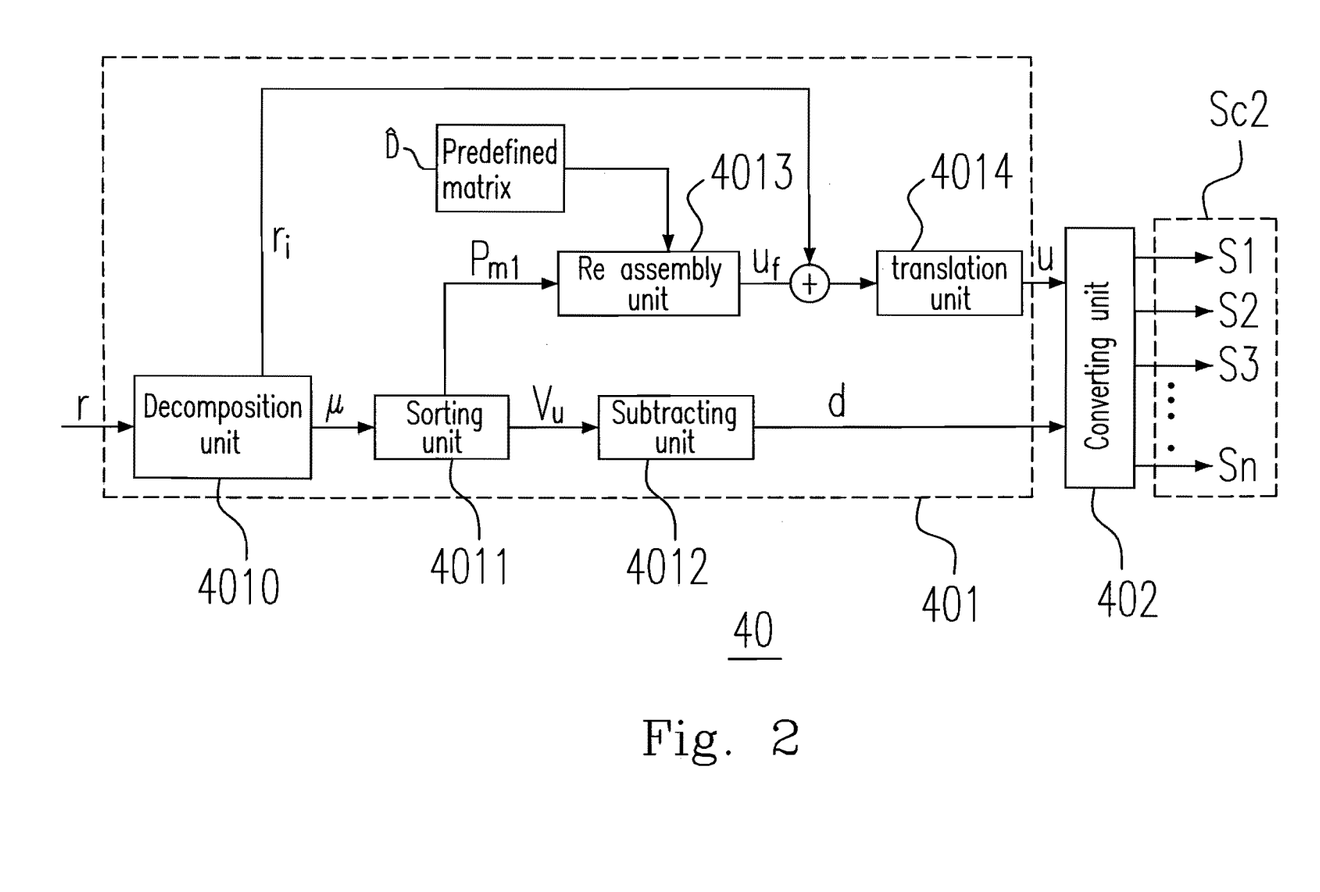
FIG. 2 a schematic diagram illustrating an apparatus for controlling a multilevel multiphase voltage source inverter in accordance with the second embodiment of the present invention.

Please refer to FIG. 2, which schematics an apparatus for controlling a voltage source inverter in accordance with a second embodiment of the present invention. The apparatus 40 for controlling a voltage source inverter includes a signal-generating unit 401 and a converter 402. The signal-generating unit 401 includes a decomposition unit 4010, a sorting unit 4011, a subtracting unit 4012, a reassembly unit 4013, and a translation unit 4014. The main difference between the first and the second embodiments is that the decomposition unit 4010 is able to decompose the input signal r and produce a plurality of integers ri and decimal fractions rf. The method is described in the following paragraphs.

The decomposition unit 4010 receives a digital input signal r, and generates a plurality of data based on the input signal r. The plurality of data represent multiple phases of the AC voltage output to be generated by the voltage source inverter. The decomposition unit 4010 decomposes each of the plurality of data into an integer ii and a decimal fraction rf ranging between 1 and −1. The sorting unit 4011 obtains a first vector µ having plural elements based on the decimal fraction ri of the each data, sorts the elements of the first vector µ to obtain a second vector Vu having plural sorted elements, and obtains a first matrix Pm1 based on the first and the second vectors µ and Vu. Similar to the first embodiment, a third vector û3 and a fourth vector û4 can be obtained based on the second vector Vu, and a fifth vector û5 is obtained by subtracting the fourth vector û4 from the third vector û3. One preferred embodiment for obtaining the vectors û4 and û5 is the same with that of the first embodiment. Values of elements of the fifth vector û5 are associated with an input period of the duration timing control signal d.

The re-assembling unit 4013 obtains a second matrix $\mu_f$ based on a transposed matrix Pm1$^T$ of the first matrix Pm1 and a pre-defined matrix $\hat{D}$. Preferably, the second matrix $\mu_f$ is a product of the transposed matrix Pm1$^T$ and the pre-defined matrix $\hat{D}$. The reassembly unit 4013 obtains a third matrix Pm3 by performing an addition and a translation operation to the second matrix $\mu_f$. Values of elements of the third matrix Pm3 are associated with the switching strategy control signal u.

The third matrix Pm3 is obtained, for example, based on the following method: The reassembly unit 4013 obtains a fourth matrix Pm4 by performing either adding or subtracting a value from each element in a same column in the second matrix $\mu_f$ to obtain the third matrix, wherein the third matrix has plural elements, each of which has one of values no less than zero after one of the adding and subtracting operations. Pm4=µf+ri, Pm3=Pm4+c, where c is the value added in or subtracted from each element in the same element in the second matrix $\mu_f$ when obtaining the third matrix.

Please refer to FIGS. 3(*a*) to 3(*c*), which are the schematic diagrams of a 2-level voltage-switching unit, a 3-level voltage-switching unit and a multiple-level voltage-switching unit respectively, according to the second embodiment of the present invention. In the illustrations of FIG. 3(*a*), the output voltage Vd can be either switched to DC voltage Vdc or zero. In FIG. 3(*b*), the output voltage Vd can be switched to DC voltage Vdc, a double DC voltage of Vdc or zero. In the illustrations of FIG. 3(*c*), the output voltage Vd can be switched to one selected from the group consisted of zero, DC voltage Vdc, a double DC voltage of Vdc, . . . , or a n−1 times of Vdc, where n is an integral.

Noted that the switching signal Sc2 in FIG. 2 includes switching signals S1, S2, S3 . . . and Sn. The switching signal Sc2 is generated based on the third matrix Pm3 and an input period of the duration time control signal d. The switching signal Sc2 can be used to control the voltage to be output from voltage switching units having 2, 3 or multiple levels.

According to the second embodiment of the present invention, assuming the plurality of values r are 0.85, 2.29, 0.57, −1.94, −1.77, the respective integer ri are 1, 2, 1, −2, −2, and the respective decimal fraction rf are −0.15, 0.29, −0.43, 0.06 and 0.23. Thus the first vector:

$$\mu = \begin{bmatrix} -0.15 \\ +0.29 \\ -0.43 \\ +0.06 \\ +0.23 \end{bmatrix}$$

The second vector can be obtained by the sorting unit 4011:

$$Vu = \begin{bmatrix} +0.29 \\ +0.23 \\ +0.06 \\ -0.15 \\ -0.43 \end{bmatrix}$$

Likewise, the first matrix can be obtained.

$$Pm1 \times \begin{bmatrix} -0.15 \\ +0.29 \\ -0.43 \\ +0.06 \\ +0.23 \end{bmatrix} = \begin{bmatrix} +0.29 \\ +0.23 \\ +0.06 \\ -0.15 \\ -0.43 \end{bmatrix}, \text{ thus } Pm1 = \begin{bmatrix} 0 & 1 & 0 & 0 & 0 \\ 0 & 0 & 0 & 0 & 1 \\ 0 & 0 & 0 & 1 & 0 \\ 1 & 0 & 0 & 0 & 0 \\ 0 & 0 & 1 & 0 & 0 \end{bmatrix}$$

The fifth vector:

$$\hat{u}5 = \hat{u}3 - \hat{u}4 = \begin{bmatrix} +1 \\ +0.29 \\ +0.23 \\ +0.06 \\ -0.15 \end{bmatrix} - \begin{bmatrix} +0.72 \\ +0.23 \\ +0.06 \\ -0.15 \\ -0.43 \end{bmatrix} = \begin{bmatrix} +0.28 \\ +0.06 \\ +0.17 \\ +0.21 \\ +0.28 \end{bmatrix}$$

The second matrix:

$$u_F = P_{m1}^T \hat{D} = \begin{bmatrix} 0 & 0 & 0 & 0 & 1 \\ 0 & 1 & 1 & 1 & 1 \\ 0 & 0 & 0 & 0 & 0 \\ 0 & 0 & 0 & 1 & 1 \\ 0 & 0 & 1 & 1 & 1 \end{bmatrix}$$

The fourth matrix:

$$Pm4 = \mu + \mu_f = \begin{bmatrix} +1 \\ +2 \\ +1 \\ -2 \\ -2 \end{bmatrix} + \begin{bmatrix} 0 & 0 & 0 & 0 & 1 \\ 0 & 1 & 1 & 1 & 1 \\ 0 & 0 & 0 & 0 & 0 \\ 0 & 0 & 0 & 1 & 1 \\ 0 & 0 & 1 & 1 & 1 \end{bmatrix} = \begin{bmatrix} 1 & 1 & 1 & 1 & 2 \\ 2 & 3 & 3 & 3 & 3 \\ 1 & 1 & 1 & 1 & 1 \\ -2 & -2 & -2 & -1 & -1 \\ -2 & -2 & -1 & -1 & -1 \end{bmatrix}$$

The third matrix Pm3=Pm4+c
Where $$c = \begin{bmatrix} 2 & 2 & 2 & 1 & 1 \\ 2 & 2 & 2 & 1 & 1 \\ 2 & 2 & 2 & 1 & 1 \\ 2 & 2 & 2 & 1 & 1 \\ 2 & 2 & 2 & 1 & 1 \end{bmatrix}, \text{ and } Pm3 = \begin{bmatrix} 3 & 3 & 3 & 2 & 3 \\ 4 & 5 & 5 & 4 & 4 \\ 3 & 3 & 3 & 2 & 2 \\ 0 & 0 & 0 & 0 & 0 \\ 0 & 0 & 1 & 0 & 0 \end{bmatrix}$$

Figure 3A:
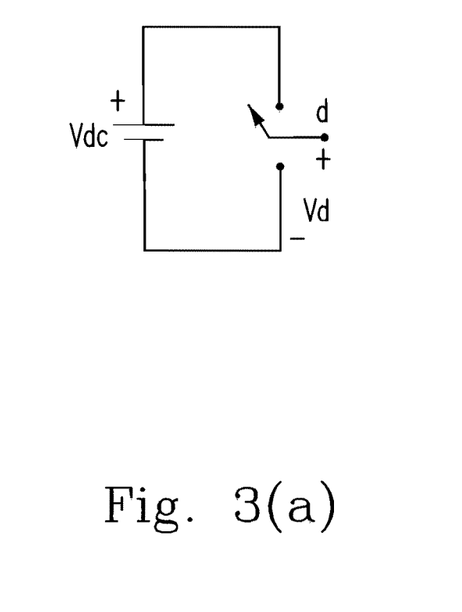
FIGS. 3(a) to 3(c) are schematic diagrams of a 2-level voltage-switching unit, a 3-level voltage-switching unit and a multiple-level voltage-switching unit respectively, according to the second embodiment of the present invention.
Figure 3B:
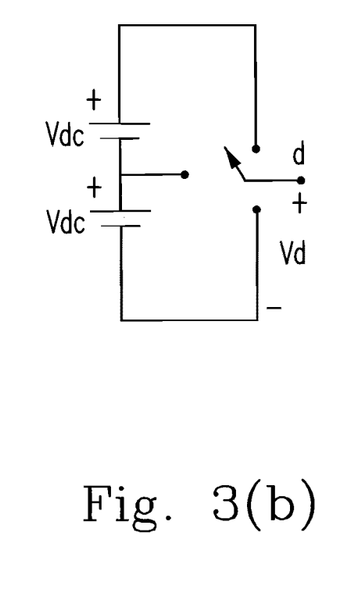
Figure 3C:
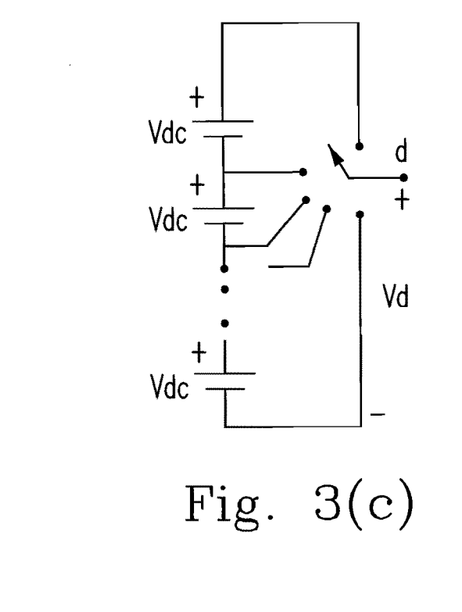
Figure 3D:
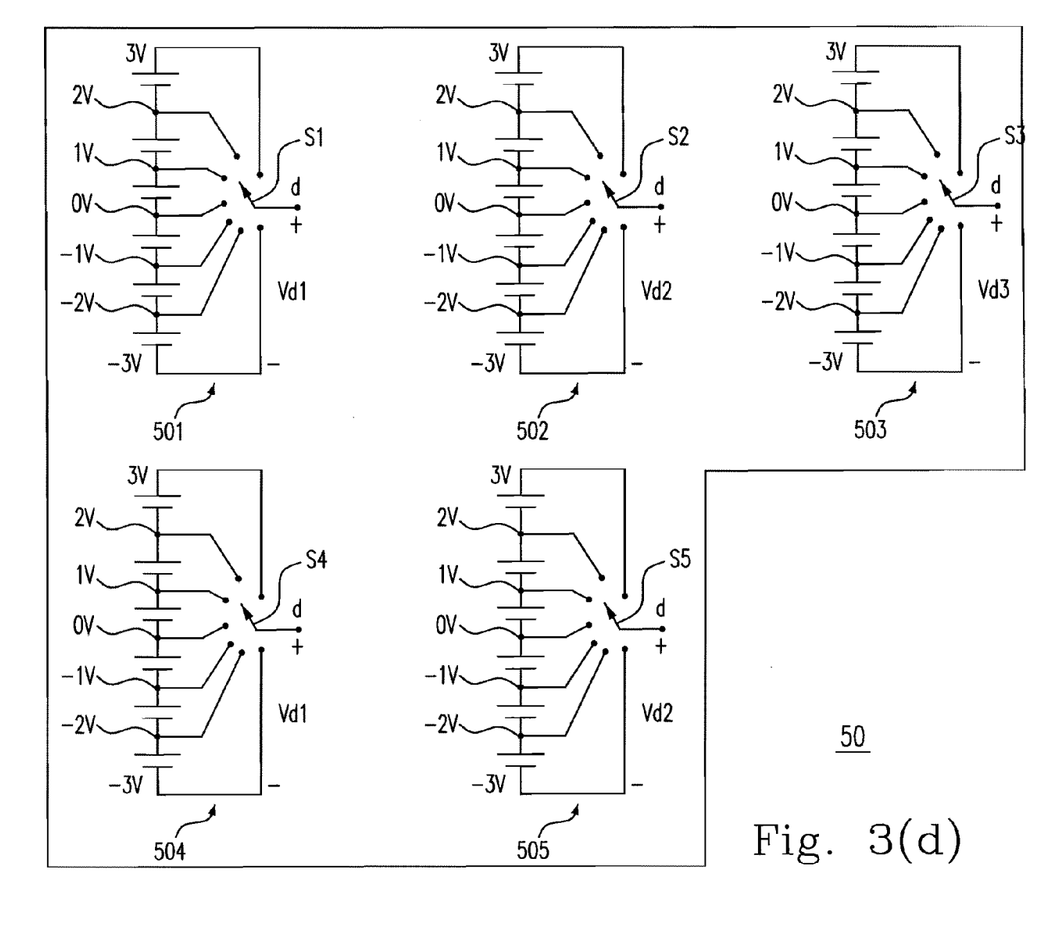
FIG. 3(d) is a schematic diagram of the 5-phase-and-7-level switching unit according to the second embodiment of the present invention.

Please refer to FIG. 3(*d*), which is a schematic diagram of a 5-phase-and-7-level switching unit according to the second embodiment of the present invention. The 5-phase-and-7-level switching unit 50 includes switching units 501, 502, 503, 504 and 505, outputting output voltages Vd1, Vd2, Vd3, Vd4 and Vd5 respectively. There are seven voltage levels for the phase voltage output of each of the switching unit, −3V, −2V, −1V, 0V, 1V, 2V and 3V, which are denoted by the value of 0, 1, 2, 3, 4, 5, and 6 respectively. The converting unit 402 uses the switching signals, S1 to S5, to control each of the switching units, 501 to 505, to be switched to one of the seven voltage levels respectively. Thus, the first column vector of the third matrix $$\begin{bmatrix} 3 \\ 4 \\ 3 \\ 0 \\ 0 \end{bmatrix}$$

represents the switching signal s1 controls the switching unit 501 and let the switching unit 501 switch to 0 volt and remains at a time period of 0.28 T. The switching signal s2 controls the switching unit 502 and let the switching unit 502 switch to 1 volt and remains at a time period of 0.28 T. The switching signal s3 controls the switching unit 503 and let the switching unit 503 switch to 0 volt and remains at a time period of 0.28 T. The switching signal s4 controls the switching unit 504 and let the switching unit 504 switch to −3 volt and remains at a time period of 0.28 T. The switching signal s5 controls the switching unit 505 and let the switching unit 505 switch to −3 volt and remains at a time period of 0.28 T.

The second column vector of the third matrix $$\begin{bmatrix} 3 \\ 5 \\ 3 \\ 0 \\ 0 \end{bmatrix}$$

represents the switching signal s1 controls the switching unit 501 and let the switching unit 501 switch to 0 volt and remains at a time period of 0.06 T. The switching signal s2 controls the switching unit 502 and let the switching unit 502 switch to 2 volts and remains at a time period of 0.06 T. The switching signal s3 controls the switching unit 503 and let the switching unit 503 switch to 0 volt and remains at a time period of 0.06 T. The switching signal s4 controls the switching unit 504 and let the switching unit 504 switch to −3 volt and remains at a time period of 0.06 T. The switching signal s5 controls the switching unit 505 and let the switching unit 505 switch to −3 volt and remains at a time period of 0.06 T. Likewise, the switched voltage and the duration period can be determined.

Based on the above, the present invention provides a simple strategy for generating switching signals of multi-phase-and-multi-level voltage source inverters, which is not limited to the types of the input signal or the loading. For arbitrary number of phases of voltage source inverter, the present invention is able to simultaneously generate a switching signal for each of the switches in the system, and allows the average voltage responding to the loading equal to the input voltage. While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims that are to be accorded with the broadest interpretation so as to encompass all such modifications and similar structures.

What is claimed is:

1. An apparatus for controlling a voltage source inverter, comprising:
   a signal-generating unit responding to an input signal to produce a switching strategy control signal and a duration timing control signal corresponding to the switching strategy control signal; and
   a converting unit responding to the switching strategy control signal and the duration timing control signal to produce a switching signal, wherein the voltage source inverter responds to the switching signal to generate a multiphase-and-multilevel AC voltage output, wherein the signal-generating unit comprises:
      a sorting unit receiving the input signal being a digital signal, and generating a plurality of data by using the input signal, wherein the plurality of data represent multiple phases of the AC voltage output to be generated by the voltage source inverter and are denoted by a first vector having plural elements, and the sorting unit sorts the plural elements of the first vector to obtain a second vector having plural sorted elements and obtains a first matrix based on the first and the second vectors;
      a subtracting unit configured to:
         obtain a third vector by preceding a first one of the sorted elements of the second vector by an element having a value of 1, and by removing a last one of the sorted elements therefrom;
         obtain a fourth vector by replacing a value of the first one of the sorted elements of the second vector with a difference between the first one and the last one of the sorted elements of the second vector; and
         obtain a fifth vector by subtracting the fourth vector from the third vector; and
      a re-assembling unit obtaining a second matrix based on a transposed matrix of the first matrix and a predefined matrix, wherein values of the sorted elements of the second matrix are associated with the switching strategy control signal, and values of elements of the fifth vector are associated with the duration timing control signal.

2. An apparatus as claimed in claim 1, wherein the second vector is a product of the first matrix and the first vector.

3. An apparatus as claimed in claim 1, wherein the predefined matrix is an upper-triangular matrix.

4. An apparatus as claimed in claim 1, further comprising a 5-phase and 7-level switching unit including:
   a first switching unit outputting a first phase voltage output;
   a second switching unit outputting a second phase voltage output;
   a third switching unit outputting a third phase voltage output;
   a fourth switching unit outputting a fourth phase voltage output; and
   a fifth switching unit outputting a fifth phase voltage output, wherein each of the phase voltage outputs has a respective one of seven voltage levels.

5. An apparatus as claimed in claim 4, wherein the converting unit uses the switching signal to control each of the switching units to be switched to a respective one of the seven voltage levels.

6. An apparatus as claimed in claim 1, wherein the signal-generating unit comprises:
   a decomposition unit receiving the input signal being a digital signal, and generating a plurality of data by using the input signal, wherein the plurality of data represent multiple phases of the AC voltage output to be generated by the voltage source inverter, and the decomposition unit decomposes each of the plurality of data into an integer and a decimal fraction ranging between 1 and −1, wherein,
   the sorting unit obtains the first vector having plural elements based on the decimal fraction of the each data, sorts the elements of the first vector to obtain the second vector having plural sorted elements, and obtains the first matrix based on the first and the second vectors.

7. An apparatus as claimed in claim 6, wherein the second vector is a product of the first matrix and the first vector.

8. An apparatus as claimed in claim 6, wherein the predefined matrix is an upper-triangular matrix.

9. An apparatus as claimed in claim 6, further comprising a 5-phase and 7-level switching unit, including:
   a first switching unit outputting a first phase voltage output;
   a second switching unit outputting a second phase voltage output;
   a third switching unit outputting a third phase voltage output;
   a fourth switching unit outputting a fourth phase voltage output; and
   a fifth switching unit outputting a fifth phase voltage output, wherein each of the phase voltage outputs has a respective one of seven voltage levels, and the converting unit uses the switching signal to control each of the switching units to be switched to one of the seven voltage levels respectively.

10. An apparatus for controlling a voltage source inverter, comprising:
   a first means for receiving an input signal, and generating a switching strategy control signal and a duration timing control signal corresponding to the switching strategy control signal in response to the input signal; and
   a second means for generating a switching signal in response to the switching strategy control signal and the duration timing control signal, and controlling the voltage source inverter to generate a multiphase and multilevel voltage output in response to the switching signal, wherein the first means comprises:
      a sorting unit receiving the input signal being a digital signal, and generating a plurality of data by using the input signal, wherein the plurality of data represent multiple phases of the AC voltage output to be generated by the voltage source inverter and are denoted by a first vector having plural elements, and the sorting unit sorts the plural elements of the first vector to obtain a second vector having plural sorted elements and obtains a first matrix based on the first and the second vectors;

a subtracting unit configured to:
obtain a third vector by preceding a first one of the sorted elements of the second vector by an element having a value of 1, and by removing a last one of the sorted elements therefrom;
obtain a fourth vector by replacing a value of the first one of the sorted elements of the second vector with a difference between the first one and the last one of the sorted elements of the second vector; and
obtain a fifth vector by subtracting the fourth vector from the third vector; and
a re-assembling unit obtaining a second matrix based on a transposed matrix of the first matrix and a pre-defined matrix, wherein values of the sorted elements of the second matrix are associated with the switching strategy control signal, and values of elements of the fifth vector are associated with the duration timing control signal.

11. A method for controlling a voltage source inverter, the method comprising steps of:
generating a switching strategy control signal and a duration timing control signal corresponding to the switching strategy control signal in response to an input signal;
using the input signal, which is a digital signal, to generate a plurality of data forming a first vector, and sorting the plurality of data to obtain a second vector;
obtaining two vectors based on the second vector, and subtracting one from the other of the two vectors to obtain a third vector denoting an input period of the duration timing control signal;
obtaining a first matrix, wherein the second vector is a product of the first matrix and the first vector, and obtaining a second matrix by multiplying a transposed matrix of the first matrix with a pre-defined matrix; and
generating a switching signal in response to the switching strategy control signal and the duration timing control signal, and controlling the voltage source inverter to generate a multiphase-and-multilevel voltage output in response to the switching signal.

12. A method as claimed in claim 11, wherein the second matrix is associated with the switching strategy control signal.

13. A method as claimed in claim 11, further comprising a sub-step of generating the switching signal based on the switching strategy control signal and the input period of the duration timing control signal.

14. A method as claimed in claim 11, further comprising sub-steps of:
obtaining a fourth vector by preceding a first element of the second vector by an element having a value of 1, and by removing the last element of the second vector therefrom;
obtaining a fifth vector by replacing the first element of the second vector with a difference between the first and the last elements of the second vector; and
obtaining the third vector by subtracting the fifth vector from the fourth vector.

15. A method as claimed in claim 11, further comprising sub-steps of:
using the input signal being a digital signal to generate a plurality of data, and decomposing each of the plurality of data into an integer and a decimal fraction ranging between 1 and −1;
obtaining the first vector having plural elements based on the decimal fractions of the each data, and sorting the plural elements of the first vector to obtain the second vector; and
obtaining a third matrix by performing an addition and a translation operations to the second matrix.

16. A method as claimed in claim 15, further comprising a sub-step of generating the switching signal based on the third matrix and the input period of the duration timing control signal, and the third matrix is associated with the switching strategy control signal.

17. A method as claimed in claim 15, further comprising sub-steps of:
obtaining a fourth matrix by adding a corresponding integer of the each data into the respective each element of the second matrix, wherein the corresponding integer is decomposed from the each data; and
performing one of operations of adding a value to and subtracting the value from each element in a same column in the fourth matrix to obtain the third matrix, wherein the third matrix has plural elements, each of which has values equal to or larger than zero after one of the adding and subtracting operations.

* * * * *